US008524590B2

(12) United States Patent
Son et al.

(10) Patent No.: US 8,524,590 B2
(45) Date of Patent: Sep. 3, 2013

(54) MEMORY DEVICE AND METHOD FOR MANUFACTURING MEMORY DEVICES

(75) Inventors: Suk-Joon Son, Seongnam-si (KR); Eun-Suk Cho, Suwon-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 278 days.

(21) Appl. No.: 13/081,849

(22) Filed: Apr. 7, 2011

(65) Prior Publication Data

US 2011/0250747 A1 Oct. 13, 2011

(30) Foreign Application Priority Data

Apr. 12, 2010 (KR) ........................ 10-2010-0033437

(51) Int. Cl.
*H01L 21/336* (2006.01)

(52) U.S. Cl.
USPC .................................. 438/594; 257/E21.422

(58) Field of Classification Search
USPC .................................. 438/594; 257/E21.422
See application file for complete search history.

(56) References Cited

U.S. PATENT DOCUMENTS

2006/0228841 A1* 10/2006 Kim et al. .................... 438/164
2009/0111280 A1 4/2009 Kao et al.
2009/0117723 A1* 5/2009 Kim et al. .................... 438/585
2010/0210099 A1* 8/2010 Hur et al. ..................... 438/586

FOREIGN PATENT DOCUMENTS

KR 10-2008-0020753 A 3/2008
KR 10-2009-0074060 A 7/2009

OTHER PUBLICATIONS

Tieer Gu et al., "Damage to Si substrates during SiO2 etching: A comparison of reactive ion etching and magnetron-enhanced reactive ion etching," J. Vac. Sci. Technol. B 12(2), Mar./Apr. 1994, pp. 567-573.

Tomokazu Ohchi et al., "Reducing Damage to Si Substrates during Gate Etching Processes," Japanese Journal of Applied Physics, vol. 47, No. 7, 2008, pp. 5324-5326.

* cited by examiner

*Primary Examiner* — Alexander Ghyka
*Assistant Examiner* — Stanetta Isaac
(74) *Attorney, Agent, or Firm* — Muir Patent Consulting, PLLC

(57) ABSTRACT

Provided are a method for manufacturing a memory device and a memory device manufactured by the method. The memory device may be a flash memory device. The method for manufacturing the memory device may include sequentially stacking a tunnel dielectric, a floating gate conductive layer, an inter-gate dielectric, and a control gate conductive layer on a semiconductor substrate; anisotropically etching the floating gate conductive layer, the inter-gate dielectric, and the control gate conductive layer to form gate structures. The gate structures may be separated by regions where top surfaces of the tunnel dielectric are exposed, the exposed top surfaces being damaged during formation of the gate structures. The method includes reacting the exposed top surfaces of the tunnel dielectric damaged during the formation of the gate structures with a reaction gas comprising ammonium fluoride to form a reaction by-product on the exposed top surfaces of the tunnel dielectric, and removing the reaction by-product.

16 Claims, 14 Drawing Sheets

Provide semiconductor substrate including damaged oxide layer into chamber — S311
↓
Plasmarize $NF_3$ and $NH_3$ source gases to generate ammonium fluoride reaction gas — S312
↓
React ammonium fluoride reaction gas with damaged oxide layer to generate reaction by-product — S313
↓
Thermally decompose reaction by-product to remove reaction by-product — S314

Provide semiconductor substrate including damaged oxide layer into chamber — S321
↓
Generate ammonium fluoride reaction gas using plasma using $H_2$ and $N_2$ and $NF_3$ and $NH_3$ source gases — S322
↓
React ammonium fluoride reaction gas with damaged oxide layer to generate reaction by-product — S323
↓
Remove reaction by-product using $NF_3$ — S324

140
130
120
110
100
II'
II
I'
I
140
130
121
111
102
100

MEMORY DEVICE AND METHOD FOR MANUFACTURING MEMORY DEVICES

CROSS-REFERENCE TO RELATED APPLICATIONS

This U.S. non-provisional patent application claims priority under 35 U.S.C. §119 of Korean Patent Application No. 10-2010-0033437, filed on Apr. 12, 2010, the entire contents of which are hereby incorporated by reference.

BACKGROUND

The present disclosure herein relates to a memory device and method for manufacturing a memory device, and more particularly, to a method for manufacturing a flash memory device having improved reliability.

Flash memory devices are devices capable of electrically erasing and programming data and preserving data when power is not supplied. Thus, demand for flash memory devices is increasing in various fields.

Such a flash memory device may be classified into a floating gate-type flash memory device and a charge trap-type flash memory device according to a kind of a memory storage layer which constitutes a unit cell.

The floating gate-type flash memory device may have a stacked gate structure including a floating gate formed by disposing a tunnel oxide layer and a control gate stacked by disposing a dielectric on the floating gate. The flash memory device having the above-described structure may increase a threshold voltage of a memory cell through a programming process in which electric charges are injected into the floating gate or decrease the threshold voltage of the memory cell through an erasing process in which electric charges are discharged from the floating gate to a semiconductor substrate. Thus, a flash memory device may read data from the memory cell using the variation of the threshold voltage.

When the flash memory device performs programming and erasing operations, since the electric charges are injected or discharged into/from the floating gate through the tunnel oxide layer, reliability of the flash memory device may be significantly affected by characteristics of the tunnel oxide layer. Also, the tunnel oxide layer may be damaged by dry etching and cleaning processes during the manufacture of the flash memory device. Thus, the characteristics of the tunnel oxide layer may be degraded to reduce the reliability of the flash memory device.

SUMMARY

The present disclosure provides a method for manufacturing a flash memory device having improved reliability.

The features of the inventive concept are not limited to the aforesaid, but other features not described herein will be clearly understood by those skilled in the art from descriptions below.

In one embodiment, a method for manufacturing a flash memory device includes: sequentially stacking a tunnel dielectric, a floating gate conductive layer, an inter-gate dielectric, and a control gate conductive layer on a semiconductor substrate; anisotropically etching the floating gate conductive layer, the inter-gate dielectric, and the control gate conductive layer to form gate structures, the gate structures separated by regions where top surfaces of the tunnel dielectric are exposed, the exposed top surfaces being damaged during formation of the gate structures; reacting the exposed top surface of the tunnel dielectric damaged during the formation of the gate structures with a reaction gas comprising ammonium fluoride to form a reaction by-product on the exposed top surface of the tunnel dielectric; and removing the reaction by-product.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
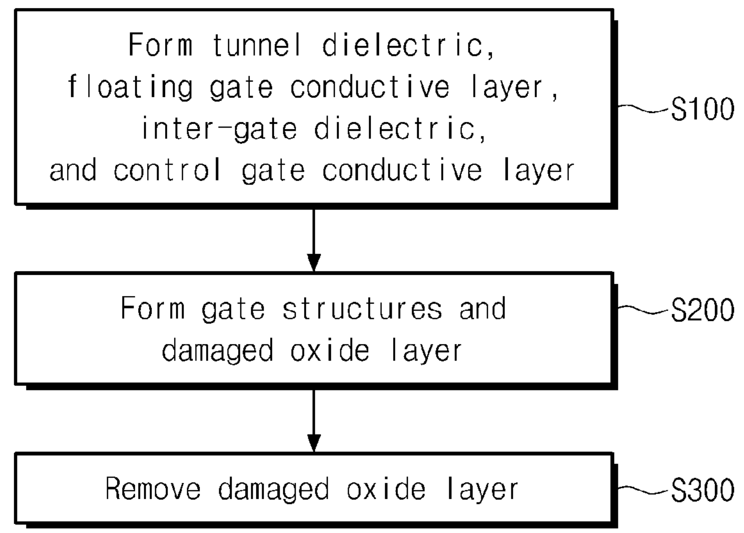
FIG. 1 is a flowchart illustrating an exemplary method for manufacturing a flash memory device according to embodiments of the inventive concept.

Advantages and features disclosed herein, and implementation methods thereof will be clarified through following embodiments described with reference to the accompanying drawings. The disclosed embodiments may, however, be embodied in different forms and should not be construed as limited to the embodiments set forth herein. Like reference numerals refer to like elements throughout.

In the following description, the technical terms are used only to explain a specific exemplary embodiment while not limiting the present invention. The terms of a singular form may include plural forms unless referred to the contrary. The meaning of "include," "comprise," "including," or "comprising," may specify a property, a region, a fixed number, a step, a process, an element and/or a component but does not exclude other properties, regions, fixed numbers, steps, processes, elements and/or components.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. However, the terms "contacts," "contacting," or "in contact with," indicates that elements are directly and physically touching. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Additionally, the embodiments disclosed in the detailed description will be described with sectional views as ideal exemplary views. In the figures, the dimensions of layers and regions may be exaggerated for clarity of illustration. Accordingly, shapes of the exemplary views may be modified according to manufacturing techniques and/or allowable errors. Therefore, the embodiments disclosed herein are not limited to the specific shapes and dimensions illustrated in the exemplary views, but may include other shapes or have different dimensions that may be created according to manufacturing processes. For example, an etched region illustrated as a rectangle may have rounded or curved features. Areas exemplified in the drawings have general properties, and are used to illustrate a specific shape of a semiconductor package region. Thus, this should not be construed as limited to the scope of the present disclosure.

Hereinafter, a method for manufacturing a flash memory device according to embodiments of the inventive concept and the flash memory device manufactured by the method will be described with reference to accompanying drawings.

Figure 2:
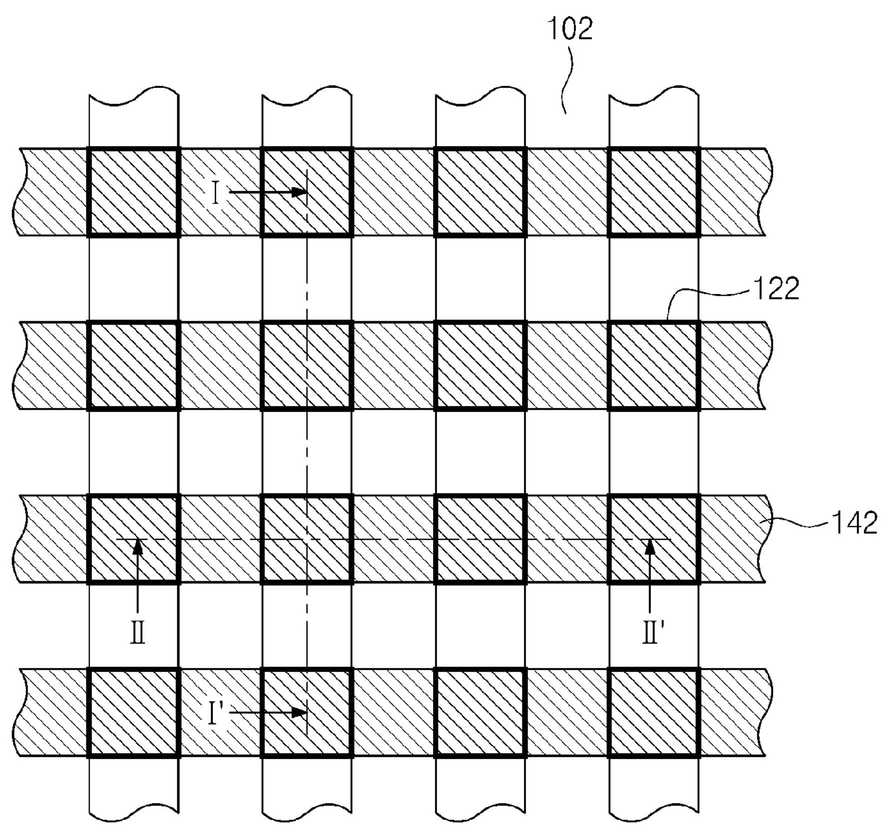
FIG. 2 is an exemplary plan view illustrating a method for manufacturing a flash memory device according to embodiments of the inventive concept.

FIG. 1 is a flowchart illustrating an exemplary method for manufacturing a flash memory device according to embodiments of the inventive concept. FIG. 2 is an exemplary plan view illustrating a method for manufacturing a flash memory device according to embodiments of the inventive concept. FIGS. 3 to 7 are exemplary sectional views illustrating a method for manufacturing a flash memory device according to an embodiment of the inventive concept.

Referring to FIG. 1, a method for manufacturing a flash memory device according to exemplary embodiments of the inventive concept includes sequentially forming a tunnel dielectric, a floating gate conductive layer, inter-gate dielectric layer, and a control gate conductive layer on a semiconductor substrate in operation S100, patterning stacked layers to form gate structures and a damaged oxide layer on the tunnel dielectric between the gate structures in operation 5200, and removing the damaged oxide layer in operation 5300.

In detail, the method for manufacturing the flash memory device according to an exemplary embodiment of the inventive concept will be described with reference to FIGS. 1, 2, and 3 to 7. FIGS. 3-7 each show two exemplary profile views of the method of manufacturing the device of FIG. 2. In each figure, a first view is in the direction of the line I-I' of FIG. 2, and a second view is in the direction of the line II-II' of FIG. 2.

Figure 3:
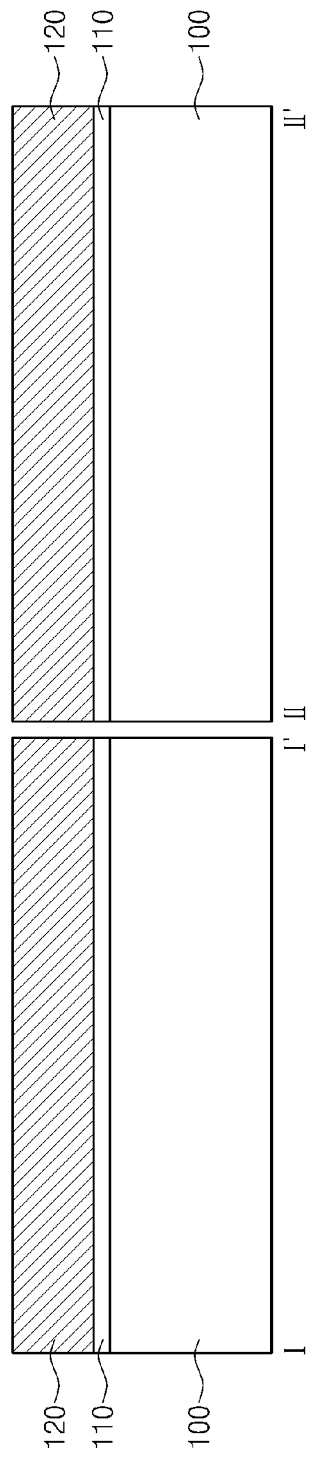
FIGS. 3 to 7 are exemplary sectional views illustrating a method for manufacturing a flash memory device according to an embodiment of the inventive concept.

Referring to FIGS. 1, 2, and 3, a tunnel dielectric layer 110 and a floating gate conductive layer 120 are formed on a semiconductor substrate 100.

The semiconductor substrate 100 may be, for example, a bulk silicon substrate, a silicon on insulator (SOI) substrate, a germanium substrate, a germanium on insulator (GOI) substrate, a silicon-germanium substrate, or an epitaxial thin film obtained by performing a selective epitaxial growth (SEG). Typical examples of useful semiconductor materials are: Group IV materials, such as Si, C, or Ge, or alloys of these such as SiC or SiGe; Group II-VI compounds (including binary, ternary, and quaternary forms), e.g., compounds formed from Group II materials such as Zn, Mg, Be or Cd; Group VI materials such as Te, Se or S, such as ZnSe, ZnSTe, or ZnMgSTe; and Group III-V compounds (including binary, ternary, and quaternary forms), e.g., compounds formed from Group III materials such as In, Al, or Ga and group V materials such as As, P, Sb or N, such as InP, GaAs, GaN, InAlAs, AlGaN, InAlGaAs, etc.

For example, the tunnel dielectric 110 may be formed of silicon oxide ($SiO_2$) through a thermal oxidation process. Also, the tunnel dielectric 110 may be formed of high-k dielectrics such as $Al_2O_3$, $HfO_2$, $ZrO_2$, $La_2O_3$, $Ta_2O_3$, $TiO_2$, $SrTiO_3$(STO), and (Ba,Sr)$TiO_3$(BST) or a multi-layer dielectric stacked by combinations thereof. The tunnel dielectric 110 may be formed using a chemical vapor deposition (CVD) or an atomic layer deposition (ALD). The tunnel dielectric 110 may have a thickness, for example, of about 50 Å to about 100 Å.

A polysilicon layer may be deposited on a surface of the tunnel dielectric 110 to form the floating gate conductive layer 120. During the deposition of the polysilicon layer, the polysilicon layer may be doped with a dopant such as phosphorus or boron. The floating gate conductive layer 120 may have a thickness, for example, of about 800 Å to about 1,000 Å.

Figure 4:
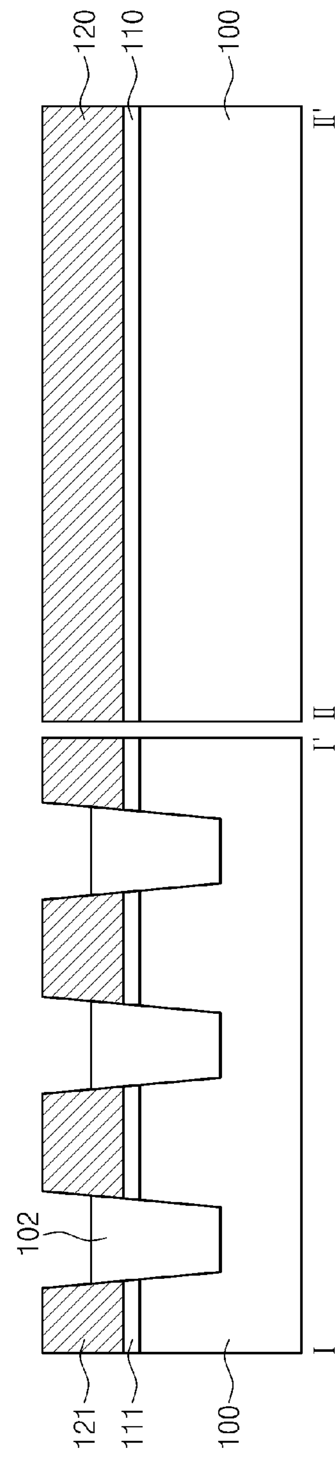

Referring to FIGS. 1, 2, and 4, a device isolation layer 102 defining active regions in the semiconductor substrate 100 is formed.

In detail, a mask pattern (not shown) may be formed on the floating gate conductive layer 120. A trench defining an active region in the semiconductor substrate 100 is then formed using the mask pattern as an etch mask. The active region may be defined in a line shape by the trench (i.e., the trench extends in a linear manner in a first direction along the substrate). The trench may have a sidewall profile in which a lateral width of the trench is gradually narrowed toward a lower portion of the trench by a property of anisotropic etching. As the trench is formed, a tunnel dielectric pattern 111 and a floating gate pattern 121 may be formed on the active region of the semiconductor substrate 100. Since the active region having a line shape is defined and the tunnel dielectric pattern 111 and the floating gate pattern 121 are formed, the tunnel dielectric pattern 111 and the floating gate pattern 121 may also have line shapes, respectively.

Thereafter, an insulation material is deposited to form a dielectric filling the trench. For example, the dielectric may include at least one of a boron-phosphor silicate glass (BPSG) layer, a high density plasma (HDP) oxide layer, an $O_3$-TEOS layer, and an USG layer. The dielectric may be formed using at least one of thin film formation technologies that provide superior step coverage. For example, the dielectric may be formed by performing one of deposition processes such as a chemical vapor deposition, a subatmospheric (CVD), a low pressure CVD (LPCVD), and a physical vapor deposition (PVD).

Next, the dielectric is planarized until a top surface of the floating gate pattern 121 is exposed to form the device isolation layer 102 within the trench. Since the device isolation layer 102 is formed after the floating gate pattern 121 is formed, a sidewall of the floating gate pattern 121 may directly contact the device isolation layer 102. Here, since an upper portion of the device isolation layer 102 (e.g., the dielectric) is recessed from the top surface of the floating gate pattern 121, only a lower sidewall of the floating gate pattern 121 may directly contact the device isolation layer 102. That is to say, the upper portion of the device isolation layer 102 may be anisotropic-etched to expose an upper sidewall of the floating gate pattern 121. Also, in one embodiment, when the device isolation layer 102 is recessed, the tunnel dielectric pattern 111 is not exposed. Since a portion of the sidewall of the floating gate pattern 121 is exposed, a contact area between an inter-gate dielectric 130 (that will be described with reference to FIG. 5) formed on the floating gate pattern 121 and the floating gate pattern 121 may be increased.

When the upper portion of the device isolation layer 102 is recessed through the anisotropic etching, a central portion (in the lateral direction) of the device isolation layer 102 may be recessed. Also, when the upper portion of the device isolation layer 102 is recessed, edge portions of the floating gate pattern 121 may be rounded.

Figure 5:
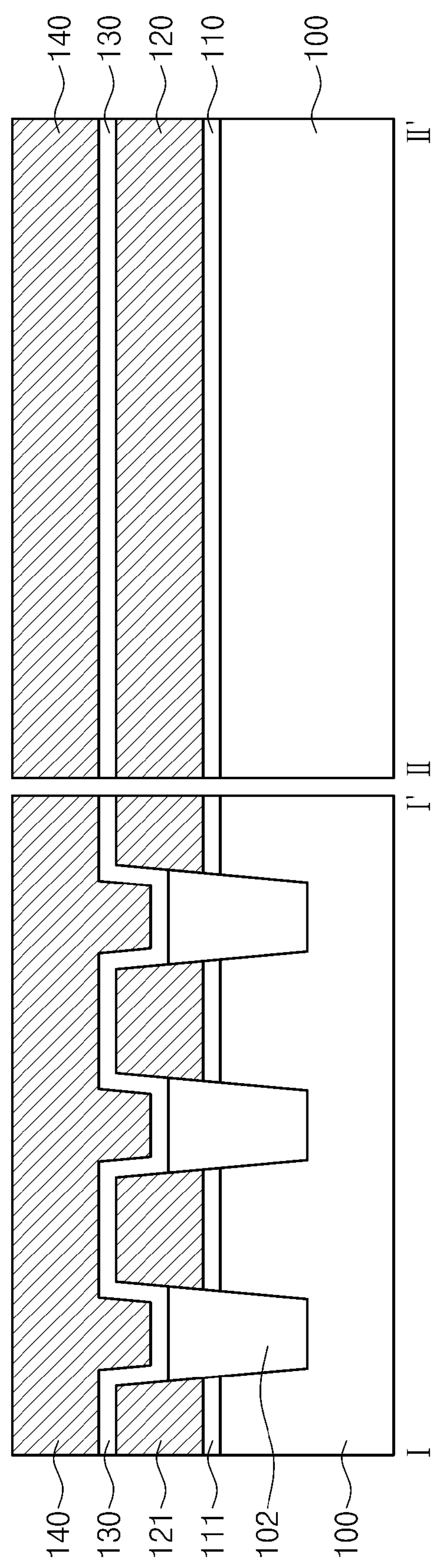

Referring to FIGS. 1, 2, and 5, the inter-gate dielectric 130 and a control gate conductive layer 140 are formed on the floating gate pattern 121.

Particularly, the inter-gate dielectric 130 and the control gate conductive layer 140 may be conformally and sequentially formed on the floating gate pattern 121 and the device isolation layer 102 using the deposition technologies having the superior step coverage. That is, the inter-gate dielectric 130 may be formed directly on the floating gate pattern 121 and the device isolation layer and may conformally cover top surfaces of the floating gate pattern 121 and the device isolation layer 102. A portion of the inter-gate dielectric 130 may thus contact sidewall portions of the floating gate pattern 121. The control gate conductive layer 140 may be formed directly on the inter-gate dielectric 130 and may be conformally formed on the inter-gate dielectric 130 to fill a space (e.g. the recess) between the floating gate patterns 121.

The inter-gate dielectric 130 may include at least one of a silicon oxide layer, a silicon nitride layer, and a silicon oxide nitride layer. In one embodiment, the inter-gate dielectric may have a stacked structure of a lower oxide layer/nitride layer/upper oxide layer to improve permittivity. For example, the inter-gate dielectric 130 may be formed of high-k metal oxides such as $Al_2O_3$, $HfO_2$, $ZrO_2$, $La_2O_3$, $Ta_2O_3$, $TiO_2$, $SrTiO_3$(STO), and (Ba,Sr)$TiO_3$(BST) or a multi-layer stacked by combinations thereof. The nitride layer may include a silicon nitride layer ($Si_xN_y$, where x and y are integers greater than 0).

A polysilicon or metal layer in which impurities are doped may be deposited to form the control gate conductive layer 140. For example, the metal layer may include at least one of a metal layer formed of tungsten or molybdenum, a conductive metal nitride layer such as a titanium nitride layer, a tantalum nitride layer, a tungsten nitride, or titanium aluminum nitride layer, and a metal silicide layer.

Figure 6:
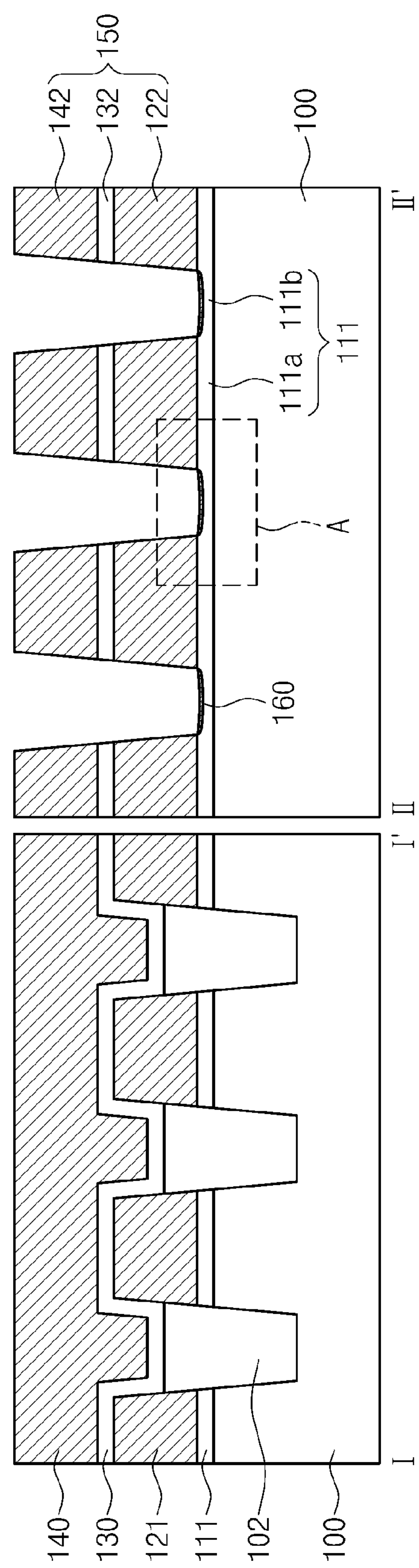

Referring to FIGS. 1, 2, and 6, the floating gate pattern 121, the inter-gate dielectric layer 130, and the control gate conductive layer 140, which are stacked on the semiconductor substrate 100 are patterned to form gate structures 150 on the semiconductor substrate 100 in operation S200.

The floating gate pattern 121, the inter-gate dielectric 130, and the control gate conductive layer 140 may be anisotropic-etched using mask patterns (not shown) to form the gate structure 150 after the mask patterns (not shown) crossing the active region are formed on the control gate conductive layer 140. Also, the tunnel dielectric pattern 111 between the gate structures 150 may be exposed by the anisotropic etching process for forming the gate structures 150. A reactive ion etching process using plasma may be performed as the anisotropic etching process for forming the gate structure 150.

As the gate structures 150 are formed, a control gate electrode 142 crossing the active region may be formed and a floating gate electrode 122 may be locally formed on the active region. As such, the gate structure may include a plurality of floating gate electrodes 122 arranged linearly in a first direction, an inter-gate dielectric 132 formed on the floating gate electrodes 122 and arranged in the first direction, and a control gate electrode 142 formed on the inter-gate dielectric 132 and arranged in the first direction. As such, a series of rows are formed including alternating rows where there is a gate structure and where there is no gate structure. For example, even rows may have the gate structures, and odd rows may have none of the gate structures (the terms "even" and "odd" merely being used to designate the alternate rows, and not to indicate a numerical value of any given row).

The gate structure 150 formed through the anisotropic etching process may have a lower portion having a width greater than that of an upper portion. As such, the gate structure may have an inclined sidewall profile. A distance (or a width) between adjacent gate structures 150, for example at the bottom of the gate structures 150, may be about 30 nm to about 40 nm.

In one embodiment, as the gate structures 150 are formed, the tunnel dielectric pattern 111 between the gate structures 150 may be exposed. Thus, the tunnel dielectric pattern 111 covering the entire active region may be divided into a first portion 111*a* disposed below the gate structure 150 and a second portion 111*b* disposed between the gate structures 150. A portion of the second portion 111*b* of the tunnel dielectric pattern 111 may be etched during the anisotropic etching process. Also, the second portion of the tunnel dielectric pattern 111 may be etched further at a central portion than an edge portion adjacent to the gate structure 150. The second portion 111*b* of the tunnel dielectric pattern 111 may have a rounded top surface. That is, the top surface of the second portion 111*b* of the tunnel dielectric pattern 111 may have a predetermined radius of curvature, and in one embodiment, may be concave.

As the gate structure 150 is formed through the anisotropic etching process using plasma, a surface of the gate structure 150 may be damaged. Also, a surface of the second portion 111*b* of the tunnel dielectric pattern 111 formed of silicon oxide may be damaged by the plasma. That is, after the gate structures 150 are formed, a damaged oxide layer damaged by the plasma may exist on a surface of the tunnel dielectric pattern 111 exposed between the gate structures 150. For example, the damaged oxide layer 160 remaining on the surface of the tunnel dielectric pattern 111 may have Si—O and Si—H bonds, which are unstable bonding states. The unstable bonds may act as undesired trap sites during an operation of the flash memory device.

That is, electric charges may be injected into the floating gate electrode 122, and simultaneously, the electric charges may be trapped in the damaged oxide layer 160 during a programming operation of the flash memory device. The electric charges trapped in the damaged oxide layer 160 may increase a threshold voltage of the flash memory device by a fringe field. Also, the electric charges trapped in the damaged oxide layer 160 may be easily discharged under poor conditions (e.g., high-temperature condition). Thus, since the electric charges are discharged from the damaged oxide layer 160, the threshold voltage of the flash memory device may be decreased. That is, the damaged oxide layer 160 may reduce data retention characteristics of the flash memory device under the high-temperature conduction and increase distribution of the threshold voltage of a memory cell. Thus, as shown in FIG. 1, in operation 300, a process for removing the damaged oxide layer 160 may be implemented after the gate structures 150 are formed.

A process for removing the residue generated in the anisotropic etching process may be performed after the gate structures 150 are formed. As one possible removal process, a wet etching process using a cleaning solution may be performed. However, it is difficult to precisely control the process conditions of the wet etching process, which may be an isotropic etching process. As a result, the wet etching process may result in the sidewall profiles of the gate structures 150 being deformed. Also, when wet etching is used, it is difficult to completely remove the damaged oxide layer 160. In the process for removing the damaged oxide layer 160, the deformation of the sidewall profile of the gate structure 150 should be minimized and the etching process condition should be easily controlled.

Also, after the gate structures 150 are formed, a treatment process such as an $O_2$ plasma treatment process may be performed to cure an etch damage of the surfaces of the gate structures 150. However, when the $O_2$ plasma treatment process is performed, high energy oxygen ions may be permeated into the tunnel dielectric pattern 111 to further increase a thickness of the damaged oxide layer 160. Thus, the process for removing the damaged oxide layer 160 may be performed after curing the surfaces of the gate structures 150.

In embodiments of the inventive concept, the damaged oxide layer 160 is removed through a dry etching process (e.g. a chemical reaction process using gases rather than liquids) after the gate structures 150 are formed, and in some embodiments, after curing the surfaces of the gate structures 150. The process for removing the damaged oxide layer 160 will be described in detail with reference to FIGS. 8A, 8B, and 9 to 11.

Figure 7:
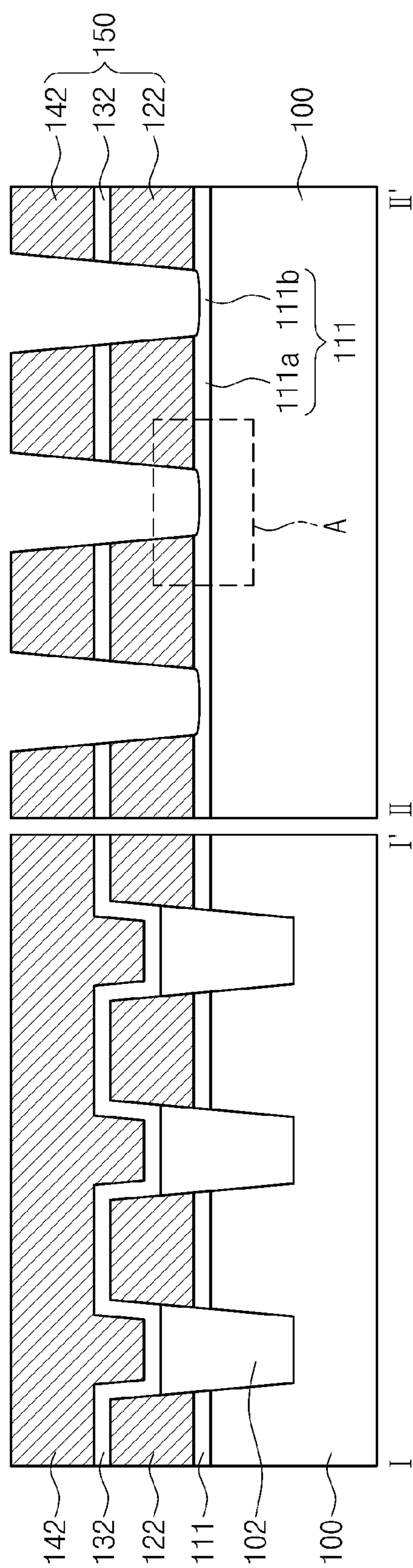

Referring to FIGS. 1, 2, and 7, as a dry etching process for removing the damaged oxide layer 160 is performed, the damaged oxide layer 160 disposed on the tunnel dielectric pattern 111 exposed between the gate structures 150 is removed. Because the damaged oxide layer 160 is removed by the chemical reaction, the tunnel dielectric pattern 111 between the gate structures 150 may be reduced in thickness by a predetermined height. That is, the second portion 111*b* of the tunnel dielectric pattern 111 disposed between the gate structures 150 may have a thickness less than that of the first portion 111*a* of the tunnel dielectric pattern 111 disposed below the gate structure 150. For example, the second portion 111*b* of the tunnel dielectric pattern 111 may have a thickness of about 80% to about 50% of that of the first portion 111*a* of the tunnel dielectric pattern 111. As another example, when the first portion 111*a* of the tunnel dielectric pattern 111 has a thickness of about 50 Å to about 80 Å, the second portion 111*b* may have a thickness of about 30 Å to about 80 Å. Also, the second portion 111*b* of the tunnel dielectric pattern 111 may have a rounded top surface (i.e., a concave surface). Thus, the second portion 111*b* of the tunnel dielectric pattern 111 may have an edge region thicker than a central region. Also, the top surface of the second portion 111*b* of the tunnel dielectric pattern 111 after the damaged oxide layer is removed may have a radius of curvature less than that of top surface of the second portion 111*b* of the tunnel dielectric pattern 111 before the damaged oxide layer is removed.

After the damaged oxide layer is removed, impurities may be doped into the semiconductor substrate 100 between the gate structures 150 to form an impurity region (not shown). Also, ashing and strip processes for removing the mask pattern used for forming the gate structures 150 may be performed. That is, after the damaged oxide layer is removed, the semiconductor substrate 100 including the gate structures 150 may be cleaned using a SCl solution in which $NH_4OH$, $H_2O_2$, and $H_2O$ are mixed with each other.

Hereinafter, a process for removing a damaged oxide layer according to embodiments of the inventive concept will be described in detail with reference to FIGS. 8A, 8B, and 9 to 11.

Figure 8A:
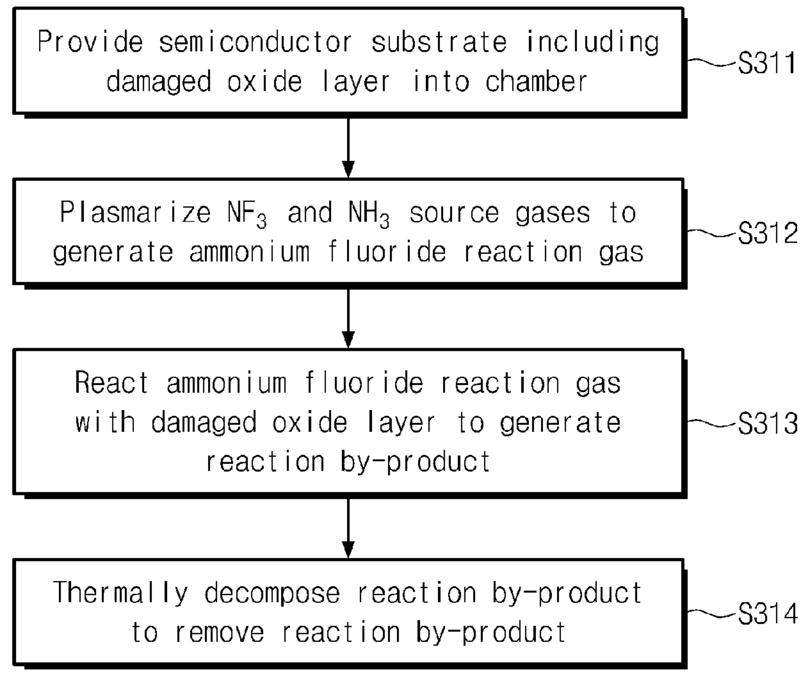
FIGS. 8A and 8B are exemplary flowcharts illustrating a process of removing a damaged oxide layer in a method for manufacturing a flash memory device according to embodiments of the inventive concept.
Figure 8B:
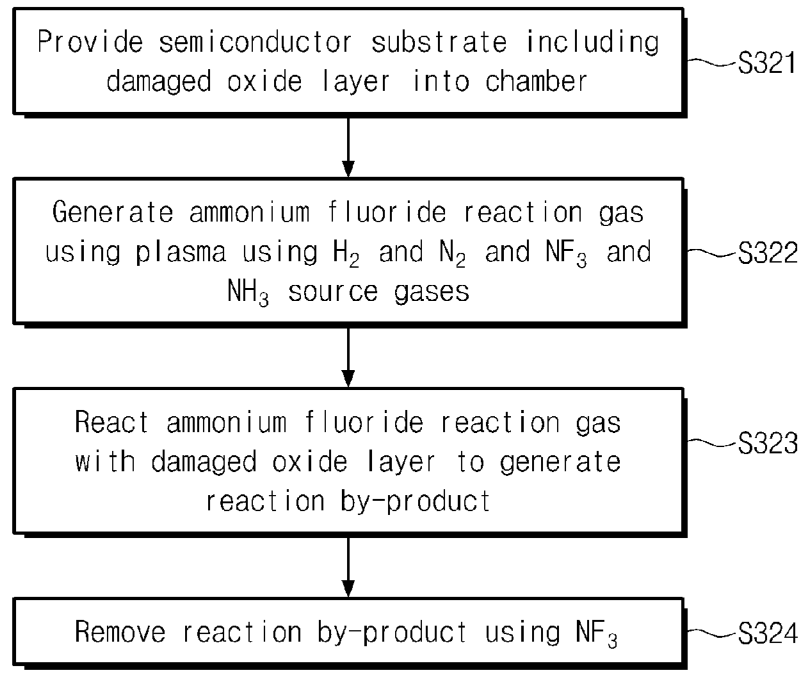
Figure 9:
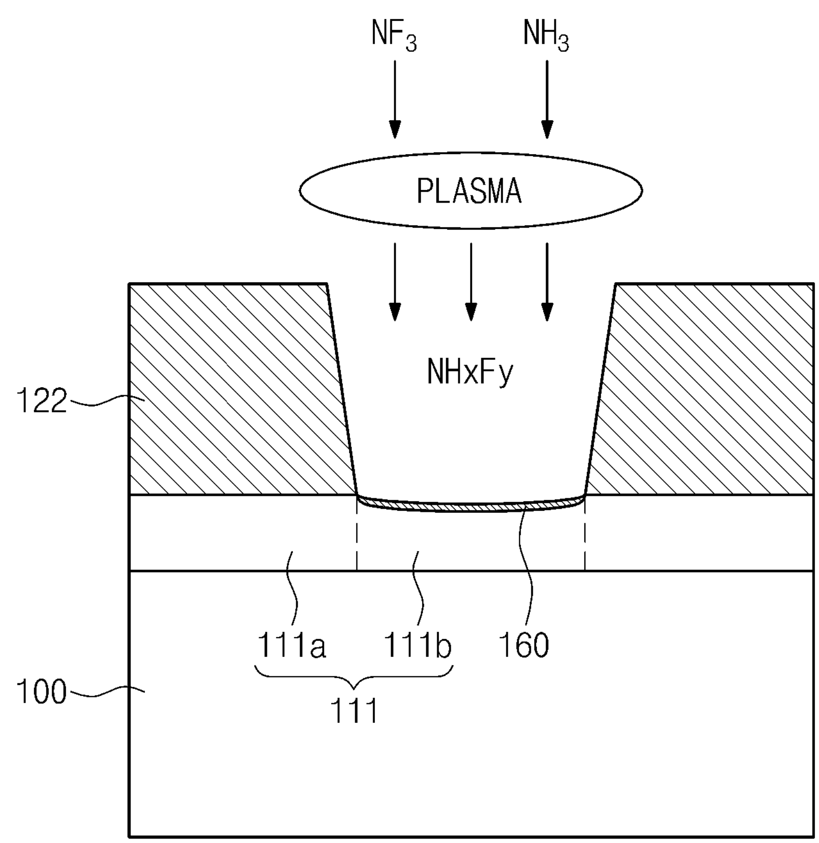
FIGS. 9 to 11 are exemplary sectional views illustrating a process of removing a damaged oxide layer in a method for manufacturing a flash memory device according to another embodiment of the inventive concept.
Figure 10:
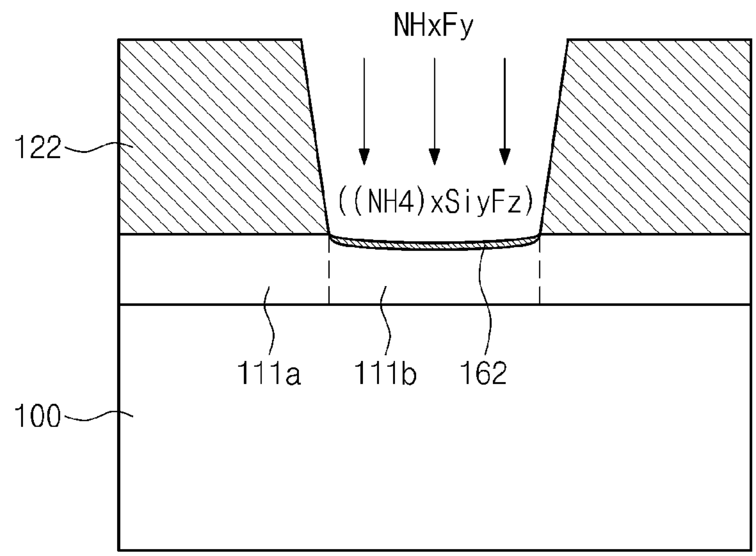
Figure 11:
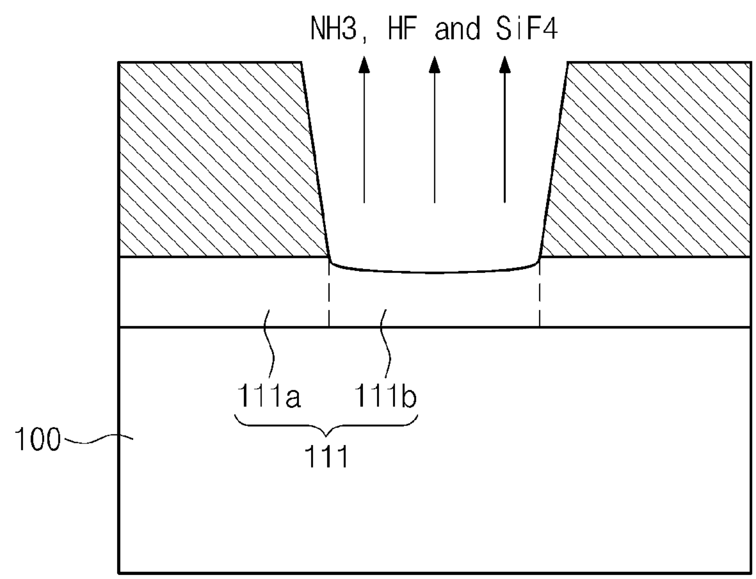

FIGS. 8A and 8B are flowcharts illustrating an exemplary process of removing a damaged oxide layer in a method for manufacturing a flash memory device according to embodiments of the inventive concept. FIGS. 9 to 11 are sectional views illustrating a process of removing a damaged oxide layer in a method for manufacturing a flash memory device according to another embodiment of the inventive concept and illustrate a portion A of each of FIGS. 6 and 7.

According to embodiments shown in FIGS. 8A, 8B, and 9 to 11, a dry etching method for removing a damaged oxide layer includes reacting a reaction gas including ammonium fluoride formed using plasma with a damaged oxide layer.

In particular, referring to FIGS. 8A and 9, the semiconductor substrate 100 including the gate structures 150 and the damaged oxide layer 160 is disposed within a sealed chamber in operation S311.

Referring to FIGS. 8A and 9, ammonium fluoride reaction gas is generated in a sealed chamber in operation S312. Source gases including fluorine and nitrogen may react with a hydrogen radical to generate the ammonium fluoride reaction gas. For example, at least two or more source gases of $N_2$, $F_2$, $NH_3$, $H_2$, F, and $NF_3$ may be supplied into the sealed chamber to react with each other, thereby generating the ammonium fluoride reaction gas.

According to an embodiment, an $NH_3$ source gas and an $NF_3$ source gas are supplied into the chamber, and a high energy microwave is applied to the source gases supplied into the chamber to generate plasma. The plasmarized $NH_3$ source gas and $NF_3$ source gases may react to generate the ammonium fluoride ($NH_4F$, $NH_4FH$, $NH_4FHF$, etc.) reaction gas. In more detail, when the plasma is generated within the chamber, the hydrogen radical may be generated from the $NH_3$ source gas, and the hydrogen radical and $NF_3$ react with each other to generate ammonium fluoride.

Referring to FIGS. 8A and 10, the ammonium fluoride reaction gas reacts with the damaged oxide layer 160 between the gate structures, i.e., the floating gate electrodes 122, to generate reaction by-products 162 on a surface of the tunnel dielectric pattern 111 in operation S313. As the reaction by-products 162 are generated, the damaged oxide layer 160 on the surface of the tunnel dielectric pattern 111 may be removed. Particularly, when the ammonium fluoride reaction gas reacts with the damaged oxide layer (i.e., silicon oxide) 160, ammonium silicon fluoride ($(NH_4)_xSi_yF_z$) and $H_2O$, which are the reaction by-products 162 may be generated on the surface of the tunnel dielectric pattern 111. Here, the semiconductor substrate 100 may be maintained at a temperature below about 100° C. to easily generate the reaction by-products 162 having a solid state.

When the reaction by-products 162 are formed on the surface of the tunnel dielectric pattern 111, the plasma of the ammonium fluoride reaction gas is supplied to the damaged oxide layer 160 while maintaining orientation (straightness). Thus, in the process for removing the damaged oxide layer 160 according to an embodiment of the inventive concept, an etched amount of the sidewall of the gate structure may be reduced when compared to the anisotropic etching process. That is, after the process for removing the damaged oxide layer 160 is performed, the deformation of the sidewall profile of the gate structure may be restrained.

Referring to FIGS. 8A and 11, a thermal process is next performed at a temperature of about 100° C. to about 200° C. to remove the reaction by-product $(NH_4)_2SiF_6$ generated on the surface of the tunnel dielectric pattern 111 in operation S314. Particularly, when the semiconductor substrate 100 is heated at the temperature of about 100° C. to about 200° C., the ammonium silicon fluoride ($(NH_4)_2SiF_6$) may be thermally decomposed into $NH_3$, HF, and $SiF_4$. When the ammonium silicon fluoride ($(NH_4)_2SiF_6$) is thermally decomposed, the generated $NH_3$, HF, $SiF_4$ and $H_2O$ may be evaporated into a gas state. Thus, the ammonium silicon fluoride may be removed from the surface of the tunnel dielectric pattern 111. Also, during the removal of the reaction by-product 162, purge gases such as nitrogen gas and argon gas may be supplied into the chamber.

As described above, the processes S312 to S314 for removing the damaged oxide layer 160 may be sequentially performed within the sealed chamber as a dry etching process. That is, an apparatus for generating the plasma, apparatuses for heating and cooling the semiconductor substrate may be provided within the sealed chamber.

FIG. 8B shows an alternative method of removing a damaged oxide layer. Referring to FIGS. 8B and 9, in the process for removing the damaged oxide layer 160, the semiconductor substrate including the gate structure and the damaged oxide layer is disposed within the sealed chamber in operation S321. Also, $H_2$ and $N_2$ source gases are supplied into the chamber. A high-energy microwave is applied to the $H_2$ and $N_2$ source gases to generate $H_2$ and $N_2$ plasma. Thereafter, $NF_3$ source gas or HF source gas is supplied into the chamber in which the $H_2$ and $N_2$ plasma are generated. Thus, in operation S322, the $H_2$ and $N_2$ plasma within the chamber reacts with the $NF_3$ source gas or the HF source gas to generate the ammonium fluoride ($NH_4F$, $NH_4FH$, $NH_4FHF$, etc) reaction gas.

Referring to FIGS. 8A and 10, the ammonium fluoride reaction gas generated using the plasma reacts with the damaged oxide layer 160 between the floating gate electrodes 122 to generate the reaction by-product 162 on the surface of the tunnel dielectric pattern 111. That is, the ammonium fluoride and the silicon oxide may react with each other to generate the ammonium silicon fluoride ($(NH_4)_xSi_yF_z$) and $H_2O$ as the reaction by-products 162 on the surface of the tunnel dielectric pattern 111. As the reaction by-products 162 are generated, the damaged oxide layer 162 may be removed from the surface of the tunnel dielectric pattern 111.

Referring to FIGS. 8B and 11, as described above, a thermal process may be performed at a temperature of about 100° C. to about 200° C. to remove a reaction by-product $(NH_4)_2SiF_6$ generated on the surface of the tunnel dielectric pattern 111 in operation 5324. Particularly, when the semiconductor substrate 100 is heated at the temperature of about 100° C. to about 200° C., the ammonium silicon fluoride ($(NH_4)_2SiF_6$) may be thermally decomposed into $NH_3$, HF, and $SiF_4$. When the ammonium silicon fluoride ($(NH_4)_2SiF_6$) is thermally decomposed, the generated $NH_3$, HF, and $SiF_4$ may be evaporated into a gas state and the $H_2O$ may be vaporized in a vapor state. According to another embodiment, a $NF_3$ cleaning gas may be supplied into the chamber, and a high-energy microwave may be applied to remove the reaction by-products 162.

Figure 12:
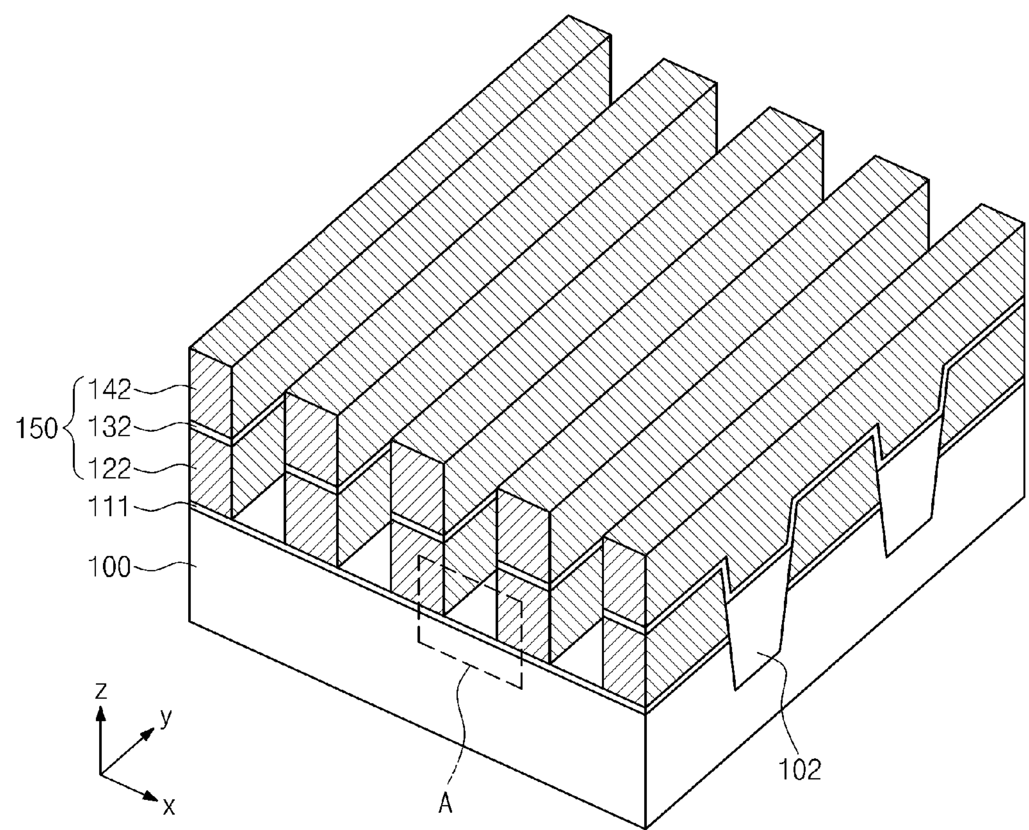
FIG. 12. is an exemplary perspective view of a flash memory device manufactured by a method for manufacturing the flash memory device according to an embodiment of the inventive concept.
Figure 13:
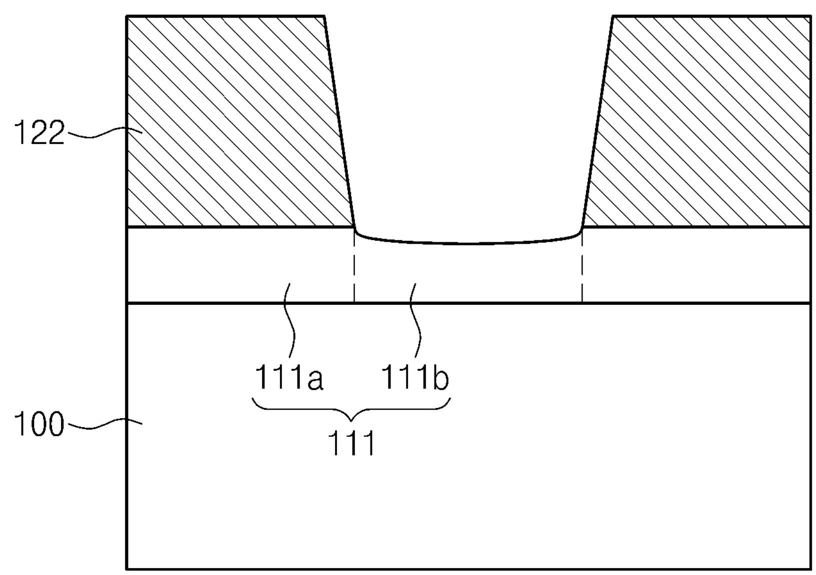
FIG. 13 is an exemplary view illustrating a portion A of FIG. 12, according to one embodiment.

FIG. 12 is a perspective view of an exemplary flash memory device manufactured by a method for manufacturing the flash memory device according to an embodiment of the inventive concept, and FIG. 13 is a view illustrating a portion A of FIG. 12.

Referring to FIGS. 12 and 13, gate structures 150 are disposed on a semiconductor substrate 100 in which active regions are defined by device isolation layers 102.

In one embodiment, the device isolation layers 102 may be parallely spaced a predetermined distance from each other to define the active regions having line patterns. A configuration of the respective active regions may be changed according to a structure of a flash memory device. Also, the respective device isolation layers 102 may have a structure protruding from a surface of the semiconductor substrate 100 that covers lower sidewalls of the gate structures 150.

A tunnel dielectric pattern 111 is disposed between the gate structures 150 and the semiconductor substrate 100. The tunnel dielectric pattern 111 may cover the entire active regions. In one embodiment, the tunnel dielectric pattern 111 has a first portion 111*a* below the gate structure 150 and a second portion 111*b* between the gate structures 150 and not covered by gate structure 150 or other elements. The second portion 111*b* of the tunnel dielectric pattern 111 may have a thickness thinner than that of the first portion 111*a* of the tunnel dielectric pattern 111. Particularly, the second portion 111*b* may have a thickness in certain regions of about 80% to about 50% of that of the first portion 111*a*. For example, the first portion 111*a* of the tunnel dielectric pattern 111 may have a thickness of about 50 Å to about 80 Å, and the second portion 111*b* may have a thickness of about 50% to 80% of that.

Also, as described above, the second portion 111*b* of the tunnel dielectric pattern 111 may have a rounded top surface by a process for removing a damaged oxide layer. Thus, the second portion 111*b* of the tunnel dielectric pattern 111 may have an edge region (e.g., region closest to the gate structures 150) thicker than a central region.

The gate structure 150 includes a floating gate electrode 122, an inter-gate dielectric pattern 132, and a control gate electrode 142, which are sequentially stacked. The gate structure 150 may have a lower portion having a width greater than of an upper portion. The gate structure 150 may have an inclined sidewall profile. In one embodiment, a distance (or a width) between the bottom portions of adjacent gate structures 150 may be about 30 nm to about 40 nm.

In more particular, the floating gate electrode 122 is locally disposed on the active region. That is, a plurality of separate floating gate electrodes 122 may be disposed below one control gate electrode 142. The plurality of floating gate electrodes 122 may be spaced from each other, and thus not directly connected to each other. In one embodiment, a lower sidewall of the floating gate electrode 122 may contact the device isolation layer 102. Thus, a sidewall of the tunnel dielectric pattern 111 may contact the device isolation layer 102. The device isolation layer 102 may have a top surface lower than that of the floating gate electrode 122. A contact area between the inter-gate dielectric pattern 132 and the floating gate electrode 122 may be changed according to a distance (or a height from a surface of the semiconductor substrate 100 to a top surface of the device isolation layer 102) between a top surface of the floating gate electrode 122 and a top surface of the device isolation layer 102. That is, the distance between the top surface of the floating gate electrode 122 and the top surface of the device isolation layer 102 may determine a coupling ratio between the control gate electrode 142 and the floating gate electrode 122 during an operation of the flash memory device.

The inter-gate dielectric pattern 132 insulates the floating gate electrode 122 from the control gate electrode 142. The inter-gate dielectric pattern 132 may conformally cover an upper portion of the floating gate electrode 122. That is, the inter-gate dielectric pattern 132 may cover the top surface and portions of both sidewalls of the floating gate electrode 122. Thus, a contact area between the floating gate electrode 122 and the inter-gate dielectric pattern 132 may be increased to increase the coupling ratio between the control gate electrode 142 and the floating gate electrode. The inter-gate dielectric pattern 132 may cover the top surface of the device isolation layer 102 and extend to the adjacent floating gate electrode 122.

The control gate electrode 142 is disposed to cross the active region of the semiconductor substrate 100. When the device isolation layer 102 covers the lower sidewall of the floating gate electrode 122, a portion of the control gate electrode 142 may be disposed between the floating gate electrodes 122. Thus, because the portion of the control gate electrode 142, along with the inter-gate dielectric pattern 132, is disposed between the floating gate electrodes 122, an interference between adjacent floating gates may be restrained.

When data is programmed and erased in the flash memory device, electric charges may tunnel the first portion 111*a* of the tunnel dielectric pattern 111 by F-N tunneling to move into the semiconductor substrate 100 or the floating gate electrode 122. The electric charges tunneling the tunnel dielectric pattern 111 are accumulated in the floating gate electrode 122. The inter-gate dielectric pattern 132 maintains characteristics of the electric charges charged into the floating gate electrode 122 and transfers a voltage of the control gate electrode 142 to the floating gate electrode 122. The control gate electrode 142 is disposed on the inter-gate dielectric pattern 132 to maintain the voltage of the floating gate electrode 122.

Figure 14A:
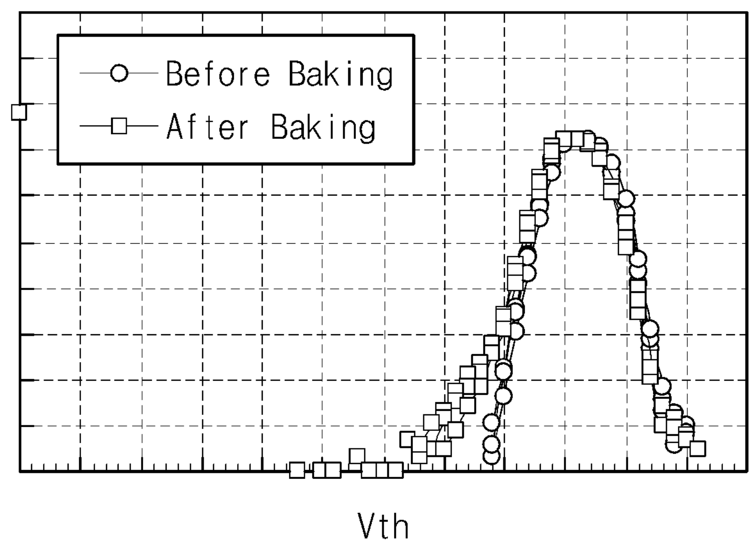
FIGS. 14A and 14B are exemplary graphs illustrating hot temperature stress characteristics of flash memory devices.
Figure 14B:
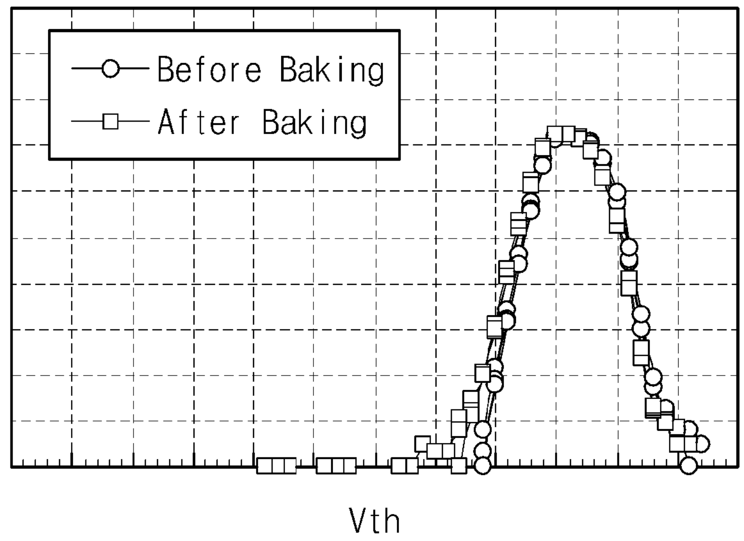

FIGS. 14A and 14B are graphs illustrating hot temperature stress (HTS) characteristics of flash memory devices. The HTS is used for measuring a variation of a threshold voltage Vth before/after high-temperature thermal treatment to estimate device properties. The variation of the threshold voltage Vth represents an amount of electric charge lost by the high-temperature thermal treatment. Thus, the less the variation of the threshold voltage Vth, the more the device properties are superior.

FIG. 14A illustrates a threshold voltage variation before/after a flash memory device manufactured without performing a process for removing a damaged oxide layer according to the disclosed embodiments is thermally treated at a temperature of about 200° C. for about 2 hours. FIG. 14B illustrates a threshold voltage variation before/after a flash memory device manufactured by performing the process for removing the damaged oxide layer according to the disclosed embodiments is thermally treated at a temperature of about 200° C. for about 2 hours.

Comparing FIG. 14A to FIG. 14B, the threshold voltage variation before/after the thermal treatment is smaller in the flash memory device in which the process for removing damaged oxide layer according to the disclosed embodiments is performed. Thus, as the disclosed process for removing the damaged oxide layer is performed, reliability of the flash memory device may be improved.

Figure 15:
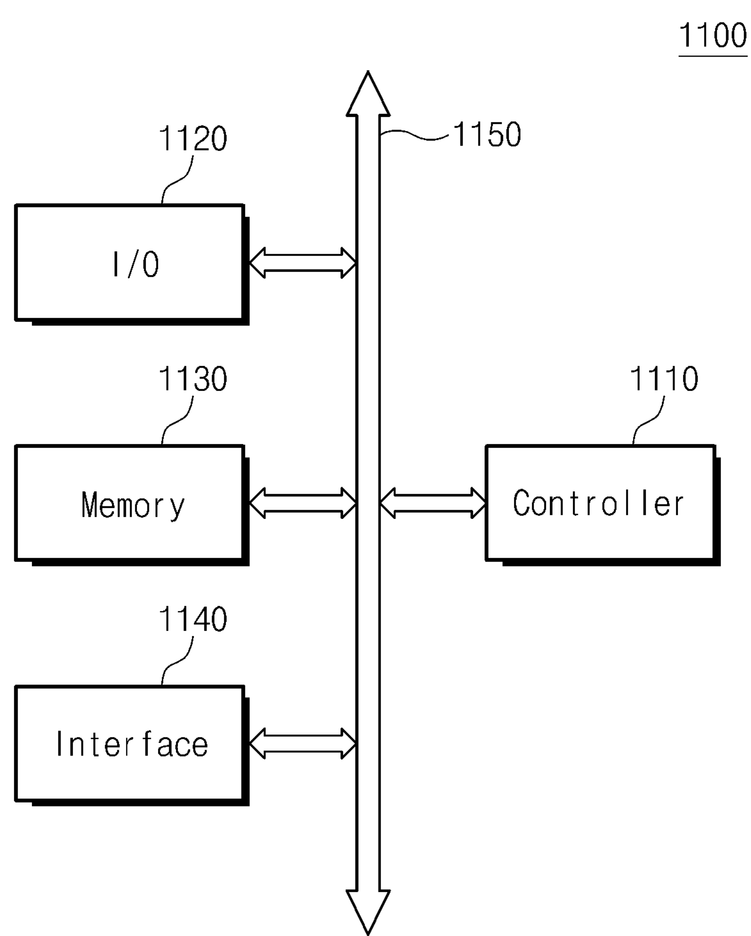
FIG. 15 is a schematic block diagram illustrating an example of a memory system including a flash memory device according to embodiments of the inventive concept.

FIG. 15 is a schematic block diagram illustrating an example of a memory system including a flash memory device according to embodiments of the inventive concept.

Referring to FIG. 15, a memory system 1100 may be applicable to a personal digital assistant (PDA), a portable computer, a web tablet, a wireless phone, a mobile phone, a digital music player, a memory card, or any electronic products capable of transmitting/receiving information in wired or wireless environments.

The memory system 1100 includes a controller 1110, an input/output unit 1120 such as a keypad, a keyboard, and a display, a memory 1130, an interface 1140, and a bus 1150. The memory 1130 and the interface 1140 are connected to each other through the bus 1150.

The controller 1110 includes at least one of a micro processor, a digital signal processor, a micro controller, and the other processing devices that are capable of performing similar functions thereto. The memory 1130 may store commands that will be executed by the controller 1110. The input/output unit 1120 may receive data or signal from the outside of the memory system 1100 or output data or signal into the outside of the memory system 1100. For example, the input/output unit 1120 may include a keyboard, a keypad, and a display device.

The memory 1130 includes the flash memory device according to the embodiments of the inventive concept. The memory 1130 may further include a different type of memory device, such as a randomly accessible non-volatile memory device, or other memory device.

The interface 1140 may transmit data to a communication network or receive data from the communication network.

Figure 16:
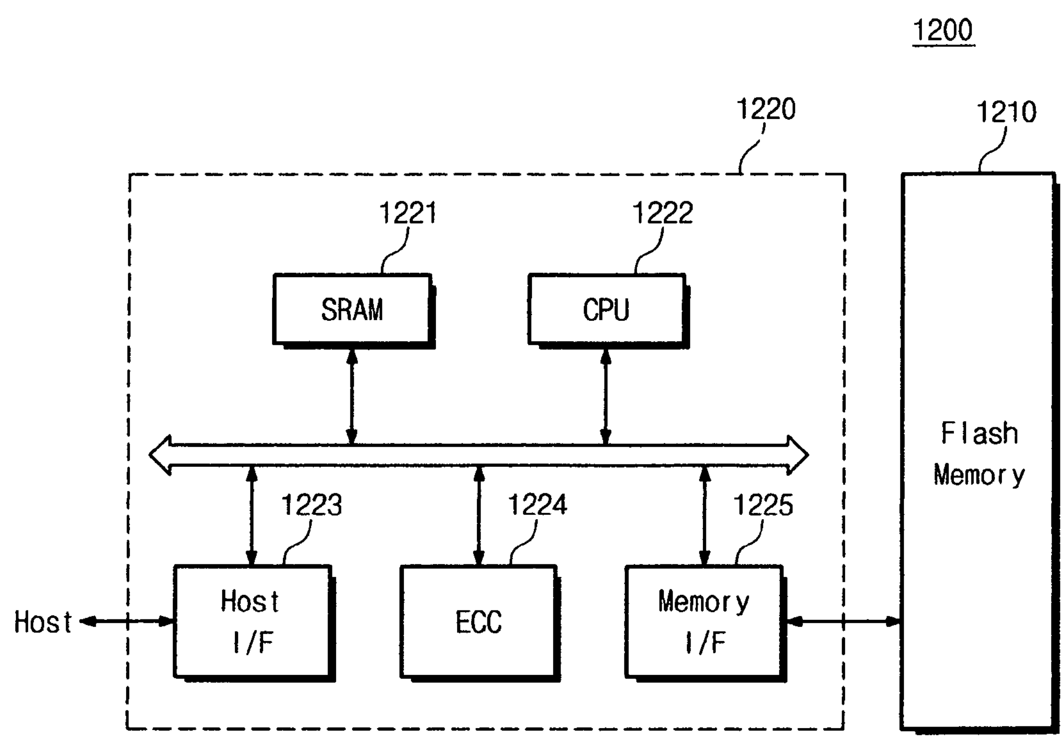
FIG. 16 is a schematic block diagram illustrating an example of a memory card including a flash memory device according to an embodiment of the inventive concept.

FIG. 16 is a schematic block diagram illustrating an example of a memory card including a flash memory device according to an embodiment of the inventive concept.

Referring to FIG. 16, a memory card 1200 for supporting large capacity data storage performance includes the flash memory device 1210 according to the inventive concept. The memory card 1200 according to the inventive concept includes a memory controller 1220 which controls various data exchange between a host and the flash memory device 1210.

An SRAM 1221 is used as an operation memory of a processing unit 1222. A host interface 1223 includes a data exchange protocol of the host connected to the memory card 1200. An error correction block 1224 is configured to detect and correct errors in data read from the multi-bit flash memory device 1210. The memory interface 1225 interfaces with the flash memory device 1210 according to the inventive concept. The processing unit 1222 performs a general control operation for exchanging data with the memory controller 1220. Although not shown, it is apparent to those skilled in the art that the memory card 1200 according to the inventive concept may further include a ROM (not shown) that stores code data for interfacing with the host.

Figure 17:
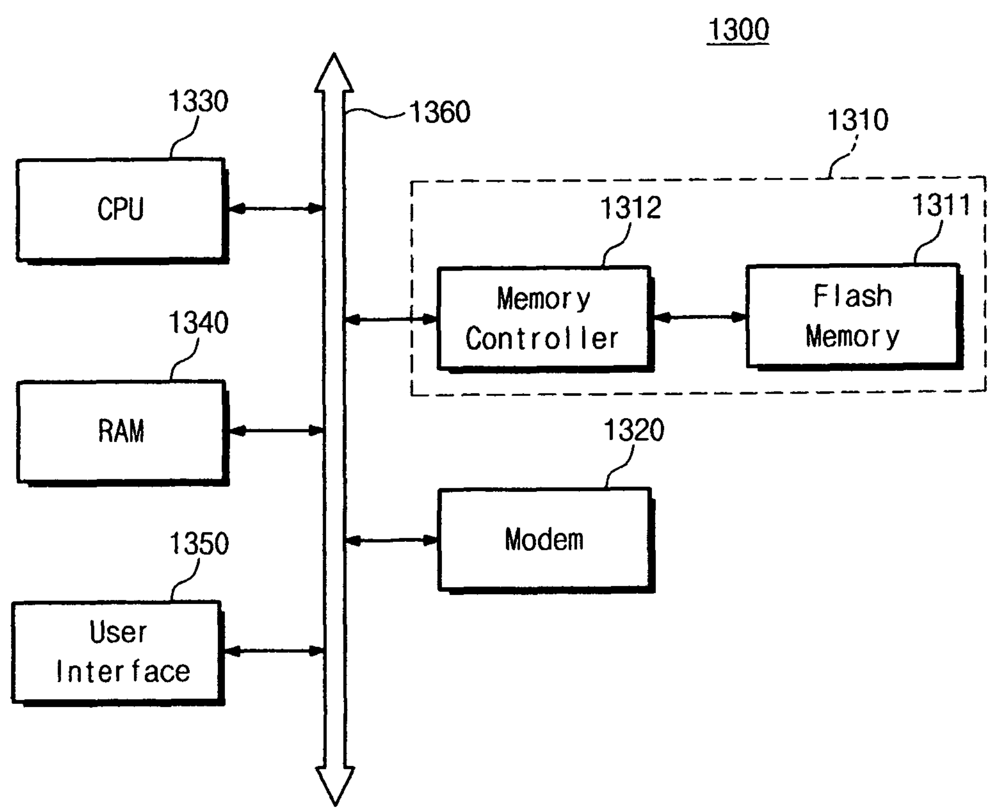
FIG. 17 is a schematic block diagram illustrating an example of an information processing system including a flash memory device according to the inventive concept.

FIG. 17 is a schematic block diagram illustrating an example of an information processing system including a flash memory device according to the inventive concept.

Referring to FIG. 17, a flash memory system 1310 according to the inventive concept is provided to an information processing system such as a mobile device or a desktop computer. The information processing system 1300 according to the inventive concept includes a flash memory system 1310, a central processing unit 1330, a RAM 1340, and a user interface 1350, which are electrically connected to a system bus 1360. The flash memory system 1310 has the substantially same configuration as that of the above-described memory system or flash memory system. Data processed by the central processing unit 1330 or data inputted from the outside is stored in the flash memory system 1310. In one embodiment, the above-described flash memory system 1310 may be configured as a semiconductor disk device (SDD). In this case, the information processing system 1300 may stably store large capacity data to the flash memory system 1310. As reliability of the flash memory system 1310 is increased, the flash memory system 1310 may reduce resources required for correcting errors to provide a high-speed data exchange function to the information processing system 1300. Although not shown, it should be apparent to those skilled in the art that the information processing system 1300 may further include an application chipset, a camera image processor (CIS), an input/output unit, or the like.

The flash memory device or the memory system according to the inventive concept may be mounted using various forms of packages. For example, the flash memory device or the memory system may be mounted into various types of packages such as Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

According to the embodiments of the inventive concept, the deformation of the sidewall profile of the gate structure may be minimized, and the damaged layer of the surface of the tunnel dielectric may be removed. Thus, when the flash memory device is operated, the repaired layer of the surface of the tunnel dielectric does not function as a trap site that causes the threshold voltage of the memory cell to change. Therefore, the reliability of the flash memory device may be improved.

The above-disclosed subject matter is to be considered illustrative and not restrictive, and the appended claims are intended to cover all such modifications, enhancements, and other embodiments, which fall within the true spirit and scope of the inventive concept. Thus, the scope of the inventive concept is to be determined by the broadest permissible interpretation of the following claims and their equivalents, and shall not be restricted or limited by the foregoing detailed description.

What is claimed is:

1. A method for manufacturing a flash memory device, the method comprising:

forming a tunnel dielectric layer on a surface of a semiconductor substrate;

forming a stacked layer structure including a floating gate conductive layer, an inter-gate dielectric, and a control gate conductive layer sequentially stacked on the tunnel dielectric layer;

anisotropically etching the stacked layer structure to form gate structures exposing at least a portion of the tunnel dielectric layer between the gate structures and to form a damaged layer on a top surface of the portion of the tunnel dielectric layer;

reacting the damaged layer with a reaction gas comprising ammonium fluoride to form a reaction by-product on the top surfaces of the portion of the tunnel dielectric layer; and removing the reaction by-product.

2. The method of claim 1, wherein the reaction gas comprising the ammonium fluoride is generated by reacting source gases containing fluorine and nitrogen with a hydrogen radical.

3. The method of claim 2, wherein the source gases contains at least two or more gases of $N_2$, $F_2$, $NH_3$, $H_2$, F, and $NF_3$.

4. The method of claim 1, wherein the tunnel dielectric comprises a thermal oxide layer, and the forming of the reaction by-product comprises reacting the reaction gas containing the ammonium fluoride with a thermal oxide layer to form ammonium silicon fluoride.

5. The method of claim 1, wherein the forming of the reaction by-product and the removing of the reaction by-product are sequentially performed within one sealed chamber.

6. The method of claim 1, wherein the forming of the reaction by-product comprises:

providing the semiconductor substrate comprising the gate structures into a sealed chamber;

supplying source gases containing fluorine and nitrogen into the chamber;

reacting the source gases with a hydrogen radical to generate a reaction gas containing the ammonium fluoride; and reacting the reaction gas containing the ammonium fluoride with the top surface of the portion of the tunnel dielectric layer to form ammonium silicon fluoride having a solid state on a surface of the tunnel dielectric layer between the gate structures.

7. The method of claim 6, wherein the providing of the semiconductor substrate, the supplying of the source gases, the reacting of the source gases, and the reacting of the reaction gas are sequentially performed within the chamber.

8. The method of claim 1, wherein, after the reaction by-product is removed, a portion of the tunnel dielectric layer between the gate structure remains, and the top surface of the tunnel dielectric layer between the gate structures after the reaction by-product is removed has a radius of curvature less than that of top surface of the tunnel dielectric layer between the gate structures before the reaction by-product is removed.

9. The method of claim 1, wherein the removing of the reaction by-product comprises thermally or chemically decomposing the reaction by-product.

10. The method of claim 1, wherein after the reaction by-product is removed, a portion of the tunnel dielectric layer between the gate structure remains, and the tunnel dielectric layer remaining next to the gate structures after the reaction by-product is removed has a rounded top surface.

11. A method for manufacturing a memory array, the method comprising:

stacking a tunnel dielectric on a substrate;

stacking one or more conductive layers on the tunnel dielectric;

forming gate structures by anisotropically etching the one or more conductive layers, such that a series of rows are formed including even rows having the one or more conductive layers on the tunnel dielectric, and odd rows having none of the one or more conductive layers, wherein a top portion of the tunnel dielectric in the odd rows comprises a damaged portion as a result of the anisotropic etching;

performing dry etching on the damaged portion of the tunnel dielectric damaged during the formation of the gate structures to remove the damaged portion of the tunnel dielectric;

wherein as a result of the dry etching, a thickness of the tunnel dielectric in the odd rows is less than thickness of the tunnel dielectric in the even rows.

12. The method of claim 11, wherein the dry etching includes:

reacting the damaged portion of the tunnel dielectric damaged during the formation of the gate structures with a reaction gas comprising ammonium fluoride to form a reaction by-product on a top surface of the tunnel dielectric; and removing the reaction by-product.

13. The method of claim 12, wherein the removing of the reaction by-product comprises thermally or chemically decomposing the reaction by-product.

14. The method of claim 13, wherein:

the tunnel dielectric comprises a thermal oxide layer; and the forming of the reaction by-product comprises reacting the reaction gas containing the ammonium fluoride with the damaged portion of thermal oxide layer to form ammonium silicon fluoride.

15. The method of claim 11, wherein:

as a result of the dry etching, a thickness of the tunnel dielectric in a center region of the odd rows is less than a thickness of the tunnel dielectric at edge regions of the odd rows.

16. A method for manufacturing a memory array, the method comprising:

stacking a tunnel dielectric on a substrate;

stacking one or more conductive layers on the tunnel dielectric;

forming gate structures by anisotropically etching the one or more conductive layers, such that a series of rows are formed including even rows having the one or more conductive layers on the tunnel dielectric, and odd rows having none of the one or more conductive layers, wherein a top portion of the tunnel dielectric in the odd rows comprises a damaged portion as a result of the anisotropic etching;

performing etching on the damaged portion of the tunnel dielectric damaged during the formation of the gate structures to remove the damaged portion of the tunnel dielectric, wherein the dry etching includes:

reacting the damaged portion of the tunnel dielectric damaged during the formation of the gate structures with a reaction gas at a first temperature, causing the formation of a solid on a top surface of the tunnel dielectric in the odd rows; and exposing the solid to a second temperature higher than the first temperature, which causes the solid to thermally decompose and evaporate.

* * * * *